United States Patent
Harada et al.

(10) Patent No.: US 12,484,448 B2
(45) Date of Patent: Nov. 25, 2025

(54) DEFORMATION DETECTION SENSOR

(71) Applicant: Murata Manufacturing Co., Ltd., Nagaokakyo (JP)

(72) Inventors: Shingo Harada, Nagaokakyo (JP); Hidekazu Kano, Nagaokakyo (JP); Mei Watanabe, Nagaokakyo (JP); Hiroaki Kitada, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 805 days.

(21) Appl. No.: 17/864,019

(22) Filed: Jul. 13, 2022

(65) Prior Publication Data

US 2022/0344572 A1    Oct. 27, 2022

Related U.S. Application Data (63) Continuation of application No. PCT/JP2021/028283, filed on Jul. 30, 2021.

(30) Foreign Application Priority Data

Jul. 30, 2020  (JP) .................. 2020-129282

(51) Int. Cl.
   H01L 41/113    (2006.01)
   H10N 30/03     (2023.01)
   H10N 30/072    (2023.01)
   H10N 30/30     (2023.01)
   H10N 30/50     (2023.01)
   H10N 30/87     (2023.01)

(52) U.S. Cl.
   CPC ......... H10N 30/302 (2023.02); H10N 30/03 (2023.02); H10N 30/072 (2023.02); H10N 30/50 (2023.02); H10N 30/872 (2023.02)

(58) Field of Classification Search
   CPC ..... H10N 30/302; H10N 30/50; H10N 30/872
   USPC .......................... 310/338, 365, 366
   See application file for complete search history.

(56) References Cited

U.S. PATENT DOCUMENTS

| 10,949,043 B2 | 3/2021 | Hashida |
| 2004/0061688 A1 | 4/2004 | Nakayama et al. |
| 2014/0063129 A1* | 3/2014 | Kondo ............ B41J 2/1621 |
| | | 29/25.35 |
| 2017/0024048 A1 | 1/2017 | Kihara et al. |
| 2019/0036528 A1 | 1/2019 | Mori et al. |

(Continued)

FOREIGN PATENT DOCUMENTS

| CN | 111033451 A | 4/2020 |
| JP | 2004118754 A | 4/2004 |
| JP | 2013178241 A | 9/2013 |

(Continued)

OTHER PUBLICATIONS

International Search Report in PCT/JP2021/028283, mailed Oct. 12, 2021, 3 pages.

*Primary Examiner* — Derek J Rosenau
(74) *Attorney, Agent, or Firm* — ArentFox Schiff LLP (57) ABSTRACT

A deformation detection sensor is provided that includes a detection electrode, a first ground electrode, a piezoelectric film sandwiched between the detection electrode and the first ground electrode, a substrate on which the detection electrode and a second ground electrode are formed, a wiring connected to the detection electrode, and a joint member that joins the wiring and the detection electrode.

20 Claims, 7 Drawing Sheets

(56) References Cited

U.S. PATENT DOCUMENTS

2020/0081578 A1 3/2020 Hashida
2020/0109995 A1 4/2020 Kitada

FOREIGN PATENT DOCUMENTS

| JP | 2015018368 A | 1/2015 |
|----|--------------|--------|
| WO | 2015159628 A1 | 10/2015 |
| WO | 2017183678 A1 | 10/2017 |
| WO | 2017208798 A1 | 12/2017 |
| WO | 2019021981 A1 | 1/2019 |
| WO | 2020/129346 A1 | 6/2020 |

* cited by examiner

DEFORMATION DETECTION SENSOR

CROSS REFERENCE TO RELATED APPLICATIONS

This application is a continuation of PCT Application No. PCT/JP2021/028283, filed Jul. 30, 2021, which claims priority to Japanese Patent Application No. 2020-129282, filed Jul. 30, 2020, the entire contents of each of which are hereby incorporated in their entirety.

TECHNICAL FIELD

The present invention relates to a deformation detection sensor that detects deformation of a detection target.

BACKGROUND

WO 2015/159628 A (hereinafter "Patent Document 1") discloses a pressing sensor using a piezoelectric film. The piezoelectric film is sandwiched between a detection electrode and a ground electrode. Moreover, the pressing sensor detects a pressing by detecting a potential difference generated between the detection electrode and the ground electrode.

The pressing sensor as disclosed in Patent Document 1 requires wiring for outputting a signal of the sensor to an arithmetic circuit. To connect the sensor and the wiring, a mounting component such as a terminal component is used. However, when a mounting component is used, the thickness of the sensor increases, and characteristics of a thin piezoelectric film cannot be utilized. In addition, it is necessary to secure a mounting part for mounting the terminal component or the like on the sensor.

SUMMARY OF THE INVENTION

Accordingly, it is an object of the present invention to provide a deformation detection sensor that utilizes the characteristics of a thin piezoelectric film and it is not necessary to secure a mounting part for mounting a terminal component or the like on the sensor.

In an exemplary aspect, a deformation detection sensor is provided that includes a detection electrode, a first ground electrode, a second ground electrode, a piezoelectric film sandwiched between the detection electrode and the first ground electrode, a substrate on which the detection electrode and the second ground electrode are formed, a wiring connected to the detection electrode, and a joint member that joins the wiring and the detection electrode. Moreover, the joint member overlaps the first ground electrode in a plan view and is disposed on a second face side of the substrate opposite to a first face side on which the piezoelectric film is disposed.

In this manner, in the deformation detection sensor of the exemplary aspect, the wiring and the detection electrode are joined by a joint member (for example, solder, anisotropic conductive resin, or the like). Thus, the deformation detection sensor of the present invention, which does not use a terminal component, utilizes the characteristics of a thin piezoelectric film. In addition, since the portion to be joined is on the second face side opposite to the first face side on which the piezoelectric film is disposed, it is not necessary to provide a mounting part on the face side of the piezoelectric film. That is, the area occupied by the piezoelectric film can increase, and the area as the entire sensor can decrease.

The exemplary embodiments of the present invention provide a deformation detection sensor that utilizes the characteristics of a thin piezoelectric film and it is not necessary to secure a mounting part for mounting a terminal component or the like on the sensor.

BRIEF DESCRIPTION OF DRAWINGS

FIG. 2(A) is a sectional view taken along the line A-A.

DETAILED DESCRIPTION

Figure 1A:
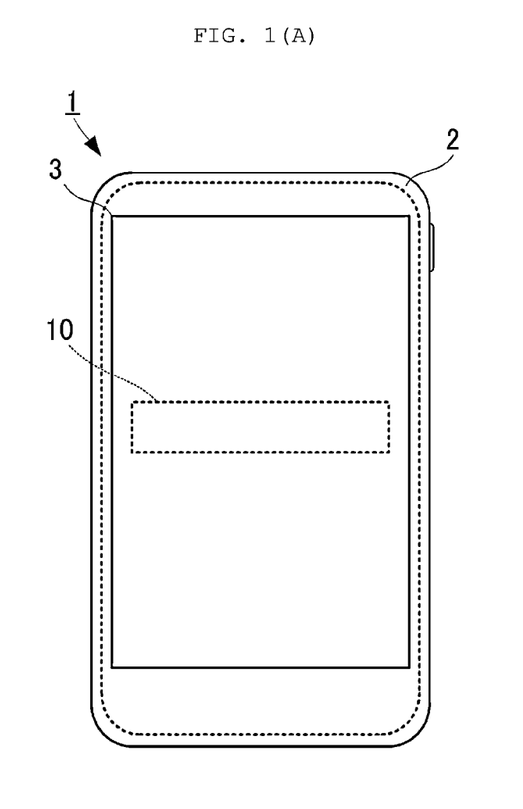
FIG. 1(A) is a plan view of electronic equipment 1 including a pressing senor 10.
Figure 1B:
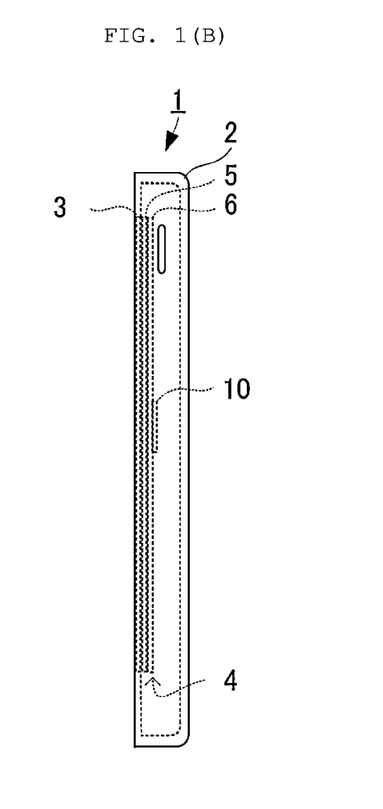
FIG. 1(B) is a side view of the electronic equipment 1.

FIG. 1(A) is a plan view of electronic equipment 1 including a pressing sensor 10. FIG. 1(B) is a side view of the electronic equipment 1.

In an exemplary aspect, the electronic equipment 1 is an information processing terminal, such as a smartphone. As shown, the electronic equipment 1 includes a housing 2, a surface panel 3, and a display device 4. Various circuits of the information processing terminal are built into the housing 2 as would be appreciated to one skilled in the art.

The display device 4 includes a capacitance sensor 5 and a display unit 6. The capacitance sensor 5 detects a touch operation on the surface panel 3. The display unit 6 includes an LCD or an OLED, and displays an image.

The surface panel 3 deforms when pressed by a finger or the like. The pressing sensor 10 is an example of the deformation detection sensor of the exemplary embodiment. The pressing sensor 10 deforms integrally with the surface panel 3. Moreover, the pressing sensor 10 has a rectangular shape in front view.

Figure 2A:
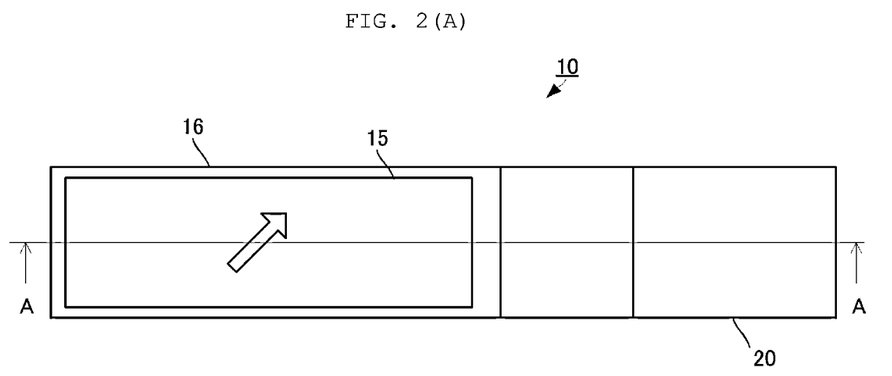
FIG. 2(A) is a plan view of the pressing senor 10.
Figure 2B:
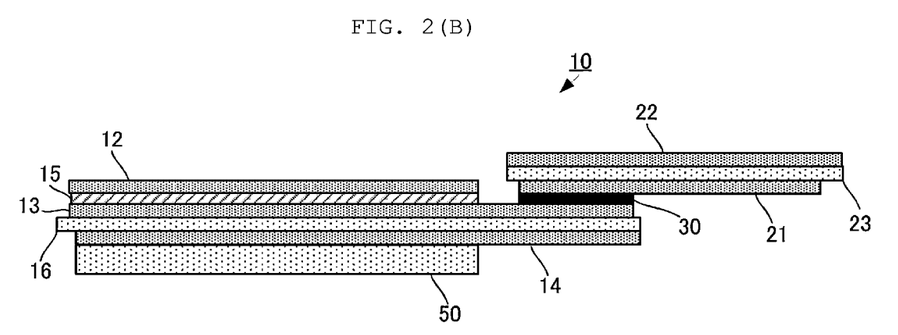

FIG. 2(A) is a plan view of the pressing sensor 10, and FIG. 2(A) is a sectional view taken along line the A-A. The pressing sensor 10 includes a piezoelectric film 15, a substrate 16, a wiring 20, and a connection member 50.

A first ground electrode 12 is disposed on a first main face of the piezoelectric film 15, and a detection electrode 13 is disposed on a second main face. The detection electrode 13 is disposed on a first main face of the substrate 16, and a second ground electrode 14 is disposed on a second main face.

The wiring 20 includes a wiring substrate 23, a wiring ground electrode 22 formed on a first main face of the wiring substrate 23, and a wiring detection electrode 21 formed on a second main face of the wiring substrate 23.

The detection electrode 13 of the substrate 16 and the wiring detection electrode 21 of the wiring 20 are joined by a joint member 30.

According to an exemplary aspect, the connection member 50 is connected to an object of deformation detection such as the surface panel 3. This configuration allows the connection member 50 to deform along with the deformation of the surface panel 3. The second ground electrode 14 is attached to an upper face of the connection member 50 by using a pressure-sensitive adhesive (not illustrated) or the like.

In an exemplary aspect, the substrate 16 is made of an insulating member, such as polyimide or the like. Electrodes of copper foil or the like are formed on both main faces of the substrate 16. In this example, the electrode formed on the first main face of the substrate 16 on the first ground electrode side serves as the detection electrode 13, and the electrode formed on the second main face on the opposite side serves as the second ground electrode 14.

The piezoelectric film 15 is attached to an upper face of the detection electrode 13 by using a pressure-sensitive adhesive (not illustrated) or the like. The first ground electrode 12 is attached to an upper face of the piezoelectric film 15. Moreover, the first ground electrode 12 is made of, for example, a conductive pressure-sensitive adhesive and a thin metal film.

The first ground electrode 12 has substantially the same area as the piezoelectric film 15 or an area larger than the area of the piezoelectric film 15 and covers the piezoelectric film 15 in a plan view thereof.

The substrate 16 extends laterally along a long axis direction of the piezoelectric film 15 in the plan view. In the extended part, the joint member 30 is disposed on the upper face of the detection electrode 13. The joint member 30 electrically connects and physically connects the detection electrode 13 to the wiring detection electrode 21.

In an exemplary aspect, the wiring substrate 23 is made of an insulating member, such as polyimide or the like. Electrodes of copper foil or the like are formed on both main faces of the wiring substrate 23. In this example, the electrode formed on the first main face of the wiring substrate 23 on the first ground electrode side serves as the wiring ground electrode 22, and the electrode formed on the second main face on the opposite side serves as the wiring detection electrode 21.

The first ground electrode 12 and the second ground electrode 14 are connected to the wiring ground electrode 22 through a via conductor (not illustrated) or the like.

In an exemplary aspect, the joint member 30 is made of, for example, solder, anisotropic conductive resin, or the like. Anisotropic conductive resin electrically connects and physically joins the detection electrode 13 and the wiring detection electrode 21 by being heat pressure-bonded.

The joint member 30 overlaps the second ground electrode 14 and the wiring ground electrode 22 in a plan view thereof. Therefore, the shielding property of the joint member 30 improves. The second ground electrode 14 and the wiring ground electrode 22 are also formed of electrodes formed on the substrate 16 and the wiring substrate 23, respectively. Therefore, the mechanical strength of the joint member 30 improves.

The pressing sensor 10 of the exemplary embodiment, which does not use a terminal component for electrical connection between the substrate 16 and the wiring 20, utilizes the characteristics of the piezoelectric film 15, which is small in thickness.

Figure 3:
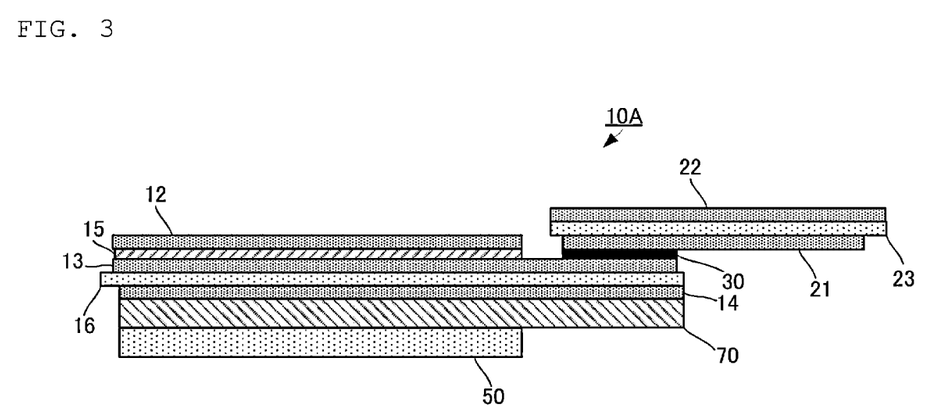
FIG. 3 is a sectional view of a pressing senor 10A of a first modification of the exemplary embodiment.

Next, FIG. 3 is a sectional view of a pressing sensor 10A of a first modification of the exemplary embodiment. It is noted that the same components as those in FIG. 2(B) are denoted by the same reference numerals, and the description thereof will be omitted.

The pressing sensor 10A of the first modification includes a reinforcing member 70 between the connection member 50 and the second ground electrode 14. The reinforcing member 70 is made of, for example, a SUS plate. The reinforcing member 70 is joined to the second ground electrode 14 and the connection member 50 by a joint member such as solder. This improves the shielding property and the mechanical strength of the joint member 30 in the pressing sensor 10A of Modification 1.

Figure 4A:
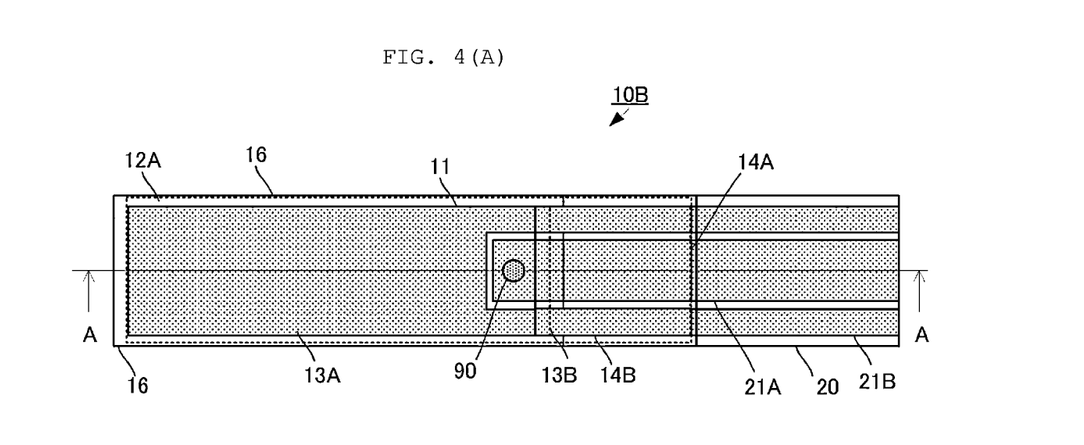
FIG. 4(A) is a plan view of a pressing senor 10B according to a second modification of the exemplary embodiment.
Figure 4B:
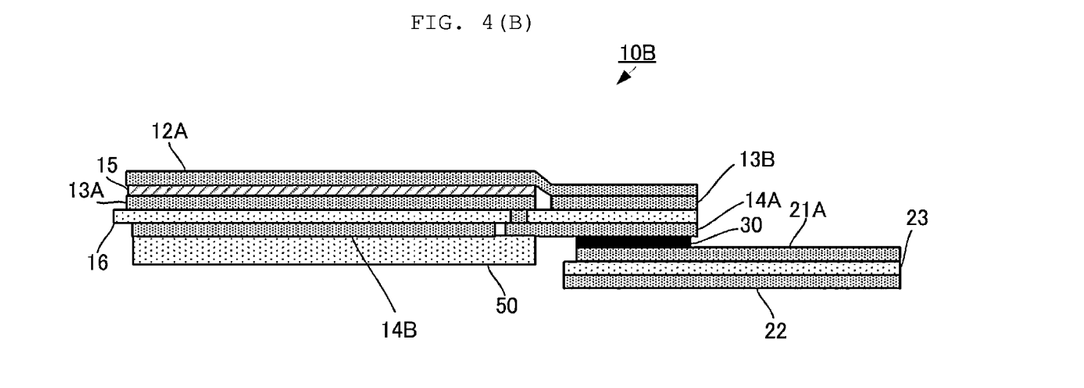
FIG. 4(B) is a sectional view taken along the line A-A.

Next, FIG. 4(A) is a plan view of a pressing sensor 10B according to second modification of the exemplary embodiment, and FIG. 4(B) is a sectional view taken along the line A-A. It is noted that the same components as those in FIGS. 2(A) and 2(B) are denoted by the same reference numerals, and the description thereof will be omitted.

In this example, the electrodes formed on the first main face and the second main face of the substrate 16 are patterned. The electrode formed on the first main face is divided into a detection electrode 13A and a ground electrode 13B. The detection electrode 13A is disposed at a position facing the piezoelectric film 15. The ground electrode 13B is disposed at a position that is not facing the piezoelectric film 15 and where the substrate 16 and the wiring 20 roughly overlap in the plan view.

The electrode formed on the second main face is divided into a detection electrode 14A and a ground electrode 14B. As illustrated by hatching in FIG. 4(A), the detection electrode 14A is formed at a position where the substrate 16 and the wiring 20 overlap and a position overlapping a part of the piezoelectric film 15 in the plan view. The detection electrode 14A is formed at a position excluding both ends of the substrate 16 in a short axis direction. The ground electrode 13B is formed at a position overlapping substantially the whole face of the piezoelectric film 15 in the plan view and at a position where the substrate 16 and the wiring 20 overlap in the plan view. The ground electrodes 13B is disposed on both end sides in the short axis direction of the position where the substrate 16 and the wiring 20 overlap in the plan view.

Moreover, in this aspect, the detection electrode 13A and the detection electrode 14A are electrically connected by a via conductor 90 at a position overlapping the piezoelectric film 15 in the plan view. It is also noted that the position of the via conductor 90 is not limited to this example. That is, in this example, the detection electrode includes a first electrode (i.e., detection electrode 13A) disposed on the first face side of the substrate 16 and a second electrode (i.e., detection electrode 14A) disposed on the second face side.

The electrode formed on the first main face of the wiring substrate 23 is also patterned. The electrode formed on the first main face of the wiring substrate 23 is divided into a wiring detection electrode 21A and a wiring ground electrode 21B. The wiring detection electrode 21A is formed at a position excluding both ends of the wiring substrate 23 in the short axis direction in the plan view. The wiring ground electrodes 21B are formed on both end sides of the wiring substrate 23 in the short axis direction in the plan view.

The wiring detection electrode 21A and the detection electrode 14A are connected by the joint member 30. Moreover, the wiring ground electrode 21B and the ground electrode 14B are connected by another joint member (not illustrated).

A first ground electrode 12A is attached to the upper face of the piezoelectric film 15. The first ground electrode 12A is made of, for example, a conductive pressure-sensitive adhesive and a thin metal film. In the pressing sensor 10B of the second modification, the first ground electrode 12A is attached in such a manner as to cover not only the upper face of the piezoelectric film 15 but also the whole face of the substrate 16. The first ground electrode 12A is also attached to the ground electrode 13B. The ground electrode 13B is connected to the ground electrode 14B by a via conductor (not illustrated) or the like. That is, in this example, the first ground electrode includes the first ground electrode 12A of the conductive member attached to the piezoelectric film 15 and the ground electrode 13B disposed on the first face side of the substrate 16.

In the pressing sensor 10B of the second modification, the wiring 20 is joined on the second main face side of the substrate 16 opposite to the first main face side on which the piezoelectric film 15 is disposed. This configuration eliminates the necessity of providing a mounting part for connecting the wiring 20 on the first main face side on which the piezoelectric film 15 is disposed. That is, the pressing sensor 10B of the second modification increases the area occupied by the piezoelectric film 15. In other words, the area as the whole sensor can be decreased with the same area of the piezoelectric film 15.

Figure 5:
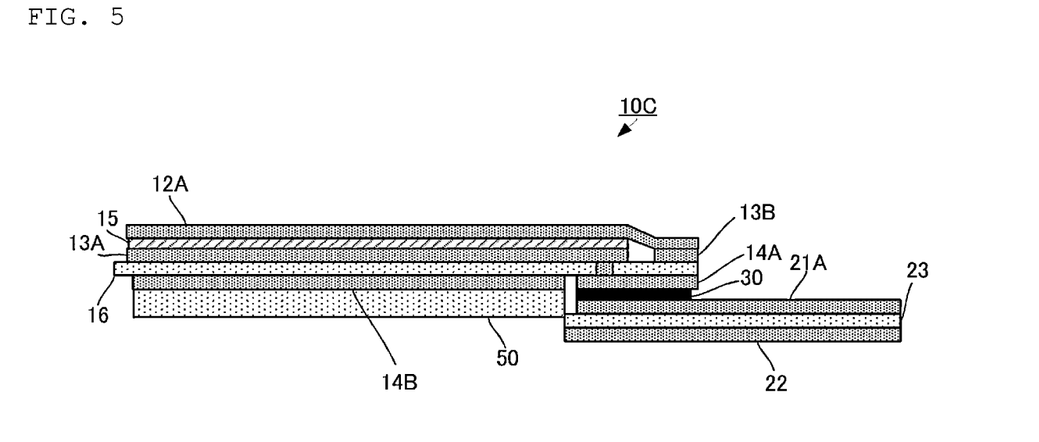
FIG. 5 is a sectional view of a pressing senor 10C of third modification of the exemplary embodiment.

FIG. 5 is a sectional view of a pressing sensor 10C according to a third modification of the exemplary embodiment. It is noted that the same components as those in the sectional view of FIG. 4(B) are denoted by the same reference numerals, and the description thereof will be omitted.

In the pressing sensor 10C according to the third modification, the area of the piezoelectric film 15 is larger than the area of the pressing sensor 10B of the second modification described above. In the example of FIG. 5, the piezoelectric film 15 is also disposed at a position overlapping the joint member 30 in the plan view. This configuration enables the pressing sensor 10C of the third modification to increase the area occupied by the piezoelectric film 15.

Figure 6:
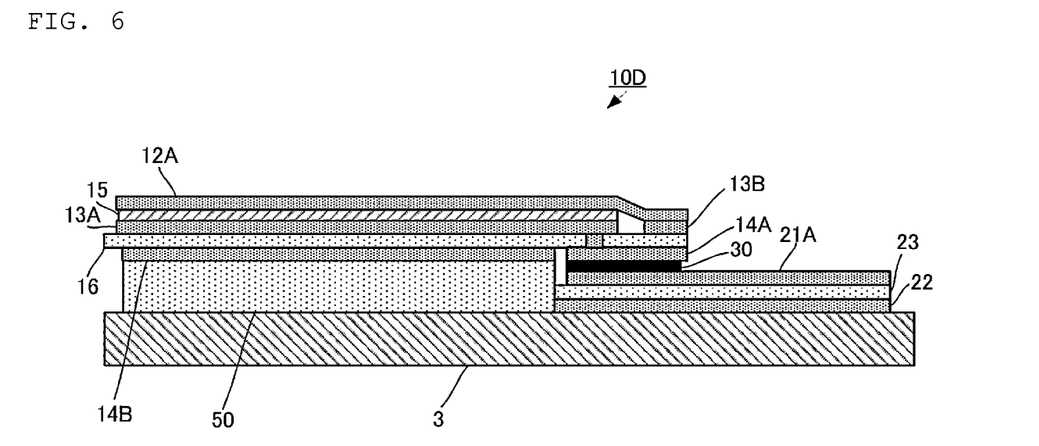
FIG. 6 is a sectional view of a pressing senor 10D of fourth modification of the exemplary embodiment.

FIG. 6 is a sectional view of a pressing sensor 10D according to a fourth modification of the exemplary embodiment. Again, it is noted that the same components as those in the sectional view of FIG. 5 are denoted by the same reference numerals, and the description thereof will be omitted.

In the example of FIG. 6, the wiring 20 is connected to the surface panel 3 that is the object of deformation detection. In FIG. 6, the wiring ground electrode 22 of the wiring 20 is in contact with the surface panel 3, but the wiring 20 is attached and fixed to the surface panel 3 by using a pressure-sensitive adhesive or the like in practice. In this example, the surface panel 3 is the object of deformation detection, but of course, the housing 2 may be the object of the deformation detection.

Since the pressing sensor 10D connects the wiring 20 to the object of deformation detection, when the object deforms, the strain due to the deformation of the object can transmit to the piezoelectric film 15 through the connection part of the wiring 20. This configuration improves detection sensitivity of the pressing sensor 10D. For example, when the output of the pressing sensor 10C in FIG. 5 is 0.15 Vpp (Vpp is a peak-to-peak voltage), the output of the pressing sensor 10D in FIG. 6 under the same condition is 0.22 Vpp, which is improved by about 1.5 times. In addition, it is possible to detect strain in a part having an area larger than the area of the piezoelectric film 15. In particular, the detection sensitivity of pressing against the connection part with the wiring 20 remarkably improves.

Figure 7:
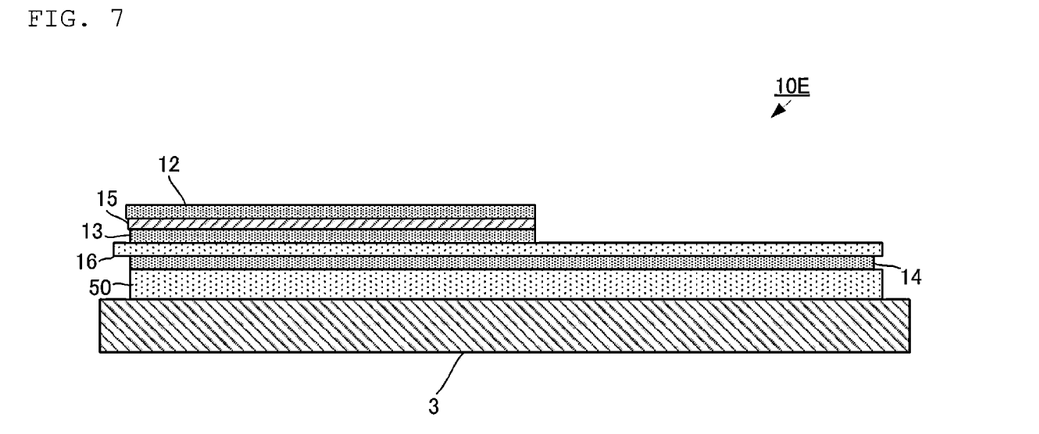
FIG. 7 is a sectional view of a pressing senor 10E of fifth modification of the exemplary embodiment.

Next, FIG. 7 is a sectional view of a pressing sensor 10E according to a fifth modification of the exemplary embodiment. It is noted that the same components as those in the sectional view of FIG. 2(B) are denoted by the same reference numerals, and the description thereof will be omitted.

In this aspect, the substrate 16 and the connection member 50 extend laterally along the long axis direction of the piezoelectric film 15 in the plan view. In FIG. 7, the second ground electrode 14 also extends laterally along the long axis direction of the piezoelectric film 15 in the plan view, but it is not essential that the second ground electrode 14 extends laterally.

In the extended part, the substrate 16 and the connection member 50 are connected to the surface panel 3 that is the object of deformation detection. That is, the substrate 16 is connected to the object of deformation detection at a position where the piezoelectric film 15 is not disposed in the plan view as well. Therefore, when the object deforms, strain due to the deformation of the object can transmit to the piezoelectric film 15 through the connection part. This configuration improves detection sensitivity of the pressing sensor 10E. In addition, it is possible to detect strain in a part having an area larger than the area of the piezoelectric film 15. In particular, the detection sensitivity of pressing against the laterally extended part remarkably improves.

Figure 8:
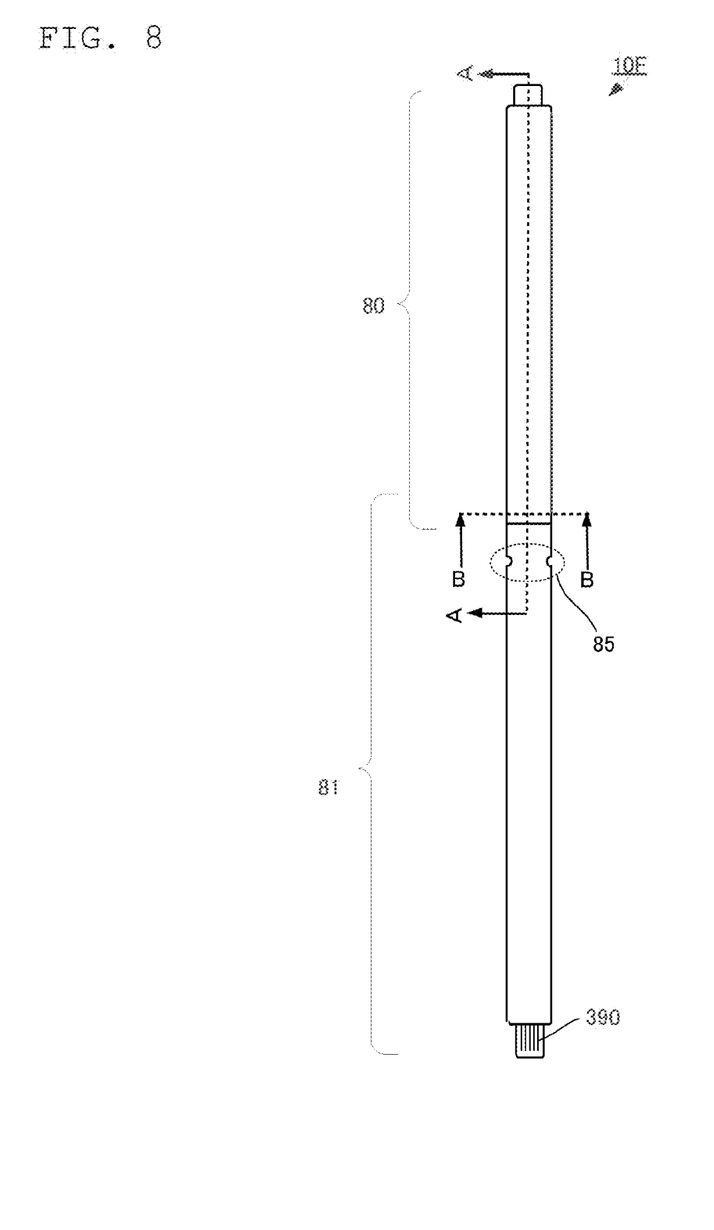
FIG. 8 is a plan view of a pressing senor 10F.
Figure 9A:
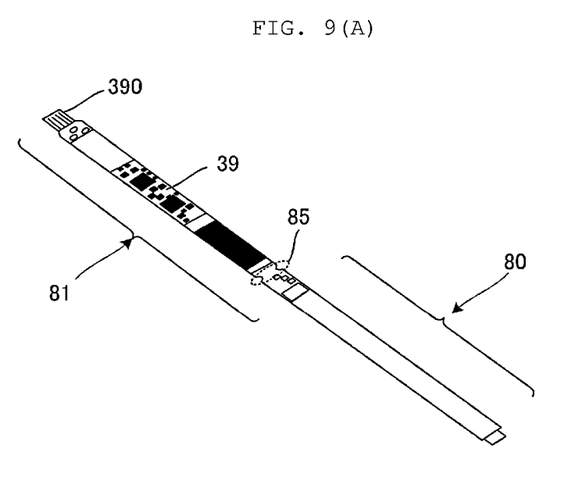
FIG. 9(A) is a perspective view of the pressing senor 10F.
Figure 9B:
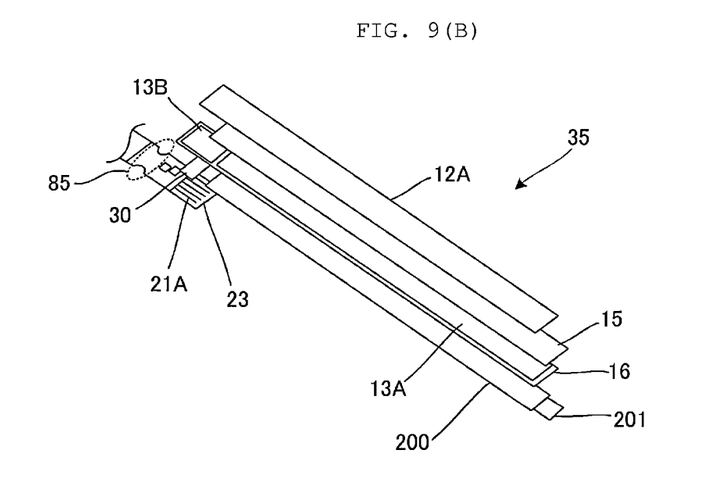
FIG. 9(B) is a partial exploded perspective view.
Figure 10A:
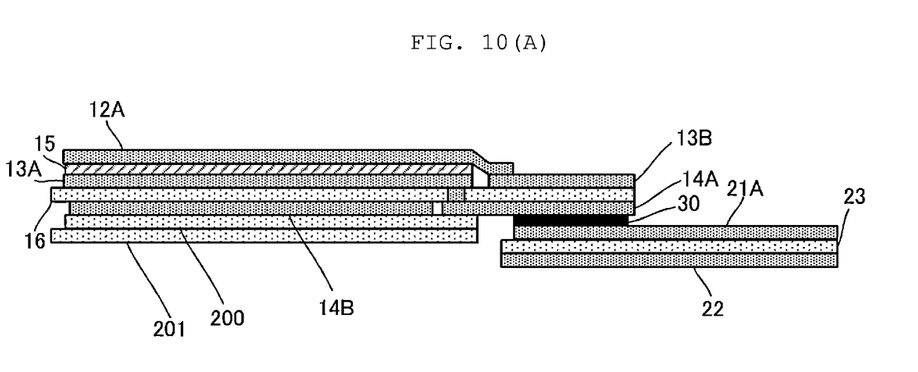
FIG. 10(A) is a sectional view taken along the line A-A in FIG. 8.
Figure 10B:
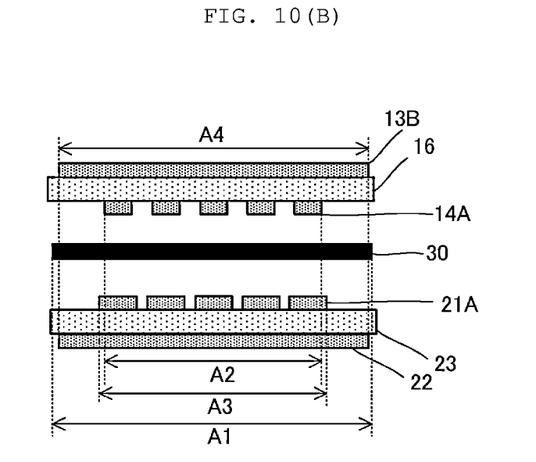
FIG. 10(B) is a sectional view taken along the line B-B in FIG. 8.

Next, FIG. 8 is a plan view illustrating the whole structure of the pressing sensor 10F, FIG. 9(A) is a perspective view of the pressing sensor 10F, and FIG. 9(B) is a partial exploded perspective view. FIG. 10(A) is a sectional view taken along the line A-A illustrated in FIG. 8. FIG. 10(B) is a sectional view taken along the line B-B illustrated in FIG. 8.

As shown, the pressing sensor 10F in this example includes a sensor unit 80 and a wiring unit 81. The wiring unit 81 includes a circuit component 39 such as an amplifier circuit and an output terminal 390. The sensor unit 80 includes a pressure-sensitive adhesive 200 and a separator 201. As illustrated in FIG. 10(A), the pressure-sensitive adhesive 200 is attached to the ground electrode 14B. The pressure-sensitive adhesive 200 is made of, for example, an acrylic pressure-sensitive adhesive. The separator 201 is attached to the pressure-sensitive adhesive 200. The separator 201 protects the pressure-sensitive adhesive face of the pressure-sensitive adhesive 200. Moreover, the separator 201 has a release part for peeling off the separator 201. The release part is a part of the separator 201 that is not attached to the pressure-sensitive adhesive 200. A user (for example, a manufacturer of electronic equipment) of the pressing sensor 10F grips and pulls the release part with tweezers or the like to peel off the separator 201. The pressure-sensitive adhesive 200 after the separator 201 is peeled off is attached to a housing or the like of an electronic component. It is also noted that the circuit component 39 does not have to be provided.

The first ground electrode 12A is attached to the ground electrode 13B. However, in this example, the first ground electrode 12A does not overlap the joint member 30 in the plan view. If both the first ground electrode 12A and the ground electrode 13B overlap the joint member 30 and the thickness of the first ground electrode 12A varies, there is a possibility that the joining strength of the joint member 30 varies. In addition, if both the first ground electrode 12A and the ground electrode 13B overlap the joint member 30 and the first ground electrode 12A is deformed by heat, the adhesion between the first ground electrode 12A and the ground electrode 13B may vary. In this case, there is a possibility that the stress related to the piezoelectric film 15 varies, and the property of the sensor would also vary. However, since the first ground electrode 12A does not overlap the joint member 30 in the plan view, such variations in joining strength and close contact can be prevented.

On the other hand, the ground electrode 13B overlaps the substrate 16 and the joint member 30 in the plan view. Since the ground electrode 13B overlaps the substrate 16, the main face of the substrate 16 is easily held in a flat shape. If the ground electrode 13B is also configured not to overlap the joint member 30 in the plan view, the main face of the substrate 16 does not always become flat due to the influence of the shape of the wiring detection electrode 21A, and there is a possibility that the joining strength of the joint member 30 varies. In the present embodiment, since the ground electrode 13B overlaps the substrate 16, the main face of the substrate 16 is held in a flat shape, and variations in joining strength of the joint member 30 can be prevented.

In this example, as illustrated in FIG. 10(B), the length (width) A1 of the joint member 30 along the X direction is larger than the width A2 of the detection electrode 14A and the width A3 of the wiring detection electrode 21A. This configuration causes the end in the width direction of the joint member 30 to contact with the substrate 16 and the wiring substrate 23 at the time of joining and improves the joining strength. In the example of FIG. 10(B), the width A3 of the wiring detection electrode 21A is wider than the width A2 of the detection electrode 14A. However, the width A2 of the detection electrode 14A may be wider than the width A3 of the wiring detection electrode 21A. That is, one of the width A3 of the wiring detection electrode 21A and the width A2 of the detection electrode 14A is wider than the other. As a result, even when the position is slightly shifted at the time of joining, the whole main face of one of the wiring detection electrode 21A and the detection electrode 14A overlaps the other main face. Therefore, stability at the time of joining the joint member 30 by heat pressure bonding improves.

Moreover, the width A4 of the ground electrode 13B and the width A4 of the wiring ground electrode 22 are larger than the width A2 of the detection electrode 14A and the width A3 of the wiring detection electrode 21A. The ground electrodes, such as the ground electrode 13B and the wiring ground electrode 22, reinforce the joint part. The width of the ground electrode being wider than the width of the detection electrode further improves stability at the time of joining the joint member 30 by heat pressure bonding and can prevent occurrence of locally high thermal stress or the like.

Unlike the detection electrode 14A and the wiring detection electrode 21A, the ground electrode is a solid electrode that is not patterned at the joint part. Disposing such a wide solid electrode can transmit heat and pressure uniformly to the joint member 30 in the planar direction. Further, disposing the solid electrode having a wide width reduces variations in stress transmitted from the wiring unit 38 to the sensor unit 35 and reduces variations in property of the sensor.

The wiring unit 81 has a part (e.g., narrowed part 85) having a short width in the plan view. The wiring unit 81 having the narrowed part 85 improves its flexibility. As a result, even when stress is generated in the wiring substrate 23 of the wiring unit 81 during use, the wiring unit 81 relieves the stress by the narrowed part 85, and transmission of the stress to the sensor unit 80 can be inhibited, and malfunction of the sensor can be prevented. Both main faces of the sensor unit 80 and the wiring unit 81 are covered with a resist (not illustrated), but the resist (not illustrated) may be removed around the narrowed part 85. The flexibility of the wiring unit 81 can be further improved by removing the resist around the narrowed part 85.

DESCRIPTION OF REFERENCE SYMBOLS

1: Electronic equipment
2: Housing
3: Surface panel
4: Display device
5: Capacitance sensor
6: Display unit
10, 10A, 10B, 10C: Pressing sensor
12, 12A: First ground electrode
13, 13A: Detection electrode
13B: Ground electrode
14: Second ground electrode
14A: Detection electrode
14B: Ground electrode
15: Piezoelectric film
16: Substrate
20: Wiring
21, 21A: Wiring detection electrode
22: Wiring ground electrode
21B: Wiring ground electrode
23: Wiring substrate
30: Joint member
50: Connection member
70: Reinforcing member
90: Via conductor

The invention claimed is:

1. A deformation detection sensor comprising:
a substrate;
a detection electrode disposed on the substrate;
a first ground electrode;
a second ground electrode disposed on the substrate;
a piezoelectric film disposed between the detection electrode and the first ground electrode;
a wiring connected to the detection electrode; and
a joint member that joins the wiring to the detection electrode,
wherein the piezoelectric film is disposed on a first surface of the substrate that is opposite to a second surface of the substrate on which the joint member is disposed.

2. The deformation detection sensor according to claim 1, further comprising a reinforcing member configured to reinforce the substrate and that is connected to the second ground electrode.

3. The deformation detection sensor according to claim 1, wherein the detection electrode comprises a first electrode disposed on the first surface of the substrate and a second electrode disposed on the second surface of the substrate.

4. The deformation detection sensor according to claim 3, wherein the detection electrode includes a via conductor that electrically connects the first electrode and the second electrode.

5. The deformation detection sensor according to claim 1, wherein the first ground electrode comprises a conductive member coupled to the piezoelectric film and the first electrode disposed on the first surface of the substrate.

6. The deformation detection sensor according to claim 1, wherein the wiring is configured to be connected to an object of deformation detection.

7. The deformation detection sensor according to claim 1, wherein the joint member overlaps the first ground electrode in a plan view of the first surface of the substrate.

8. The deformation detection sensor according to claim 3, wherein the piezoelectric film is coupled to the first surface of the substrate with the first electrode of the detection electrode disposed therebetween.

9. The deformation detection sensor according to claim 8, wherein the joint member is coupled to the second surface of the substrate with the second electrode of the detection electrode disposed therebetween.

10. The deformation detection sensor according to claim 1, wherein the first ground electrode is disposed on a first main face of the piezoelectric film and the detection electrode is disposed on a second main face of the piezoelectric film opposite the first main surface.

11. The deformation detection sensor according to claim 10, wherein the detection electrode is disposed on the first surface of the substrate and the second ground electrode is disposed on the second surface of the substrate.

12. The deformation detection sensor according to claim 1, wherein the wiring includes a wiring substrate, a wiring ground electrode disposed on a first surface of the wiring substrate, and a wiring detection electrode disposed on a second surface of the wiring substrate opposite the first surface.

13. The deformation detection sensor according to claim 12, wherein the detection electrode is coupled to the wiring detection electrode by the joint member.

14. The deformation detection sensor according to claim 1, wherein the detection electrode is disposed at a position where the substrate overlaps the wiring and at a position that only partially overlaps the piezoelectric film in a plan view of the first surface of the substrate.

15. The deformation detection sensor according to claim 14, wherein the detection electrode is disposed at a position that excludes both ends of the substrate in a direction orthogonal to the plan view.

16. The deformation detection sensor according to claim 15, wherein the second ground electrode is disposed at a position that overlaps a whole face of the piezoelectric film in the plan view of the first surface of the substrate and at a position where the substrate overlaps the wiring in the plan view of the first surface of the substrate.

17. A deformation detection sensor comprising:
a substrate having first and second surfaces that oppose each other;
a detection electrode disposed on at least one of the first and second surfaces of the substrate;
a first ground electrode disposed above the first surface of the substrate;
a second ground electrode disposed on the substrate;
a piezoelectric film disposed between the detection electrode and the first ground electrode;
a wiring connected to the detection electrode; and
a joint member that joins the wiring to the detection electrode,
wherein the piezoelectric film is disposed above the first surface of the substrate.

18. The deformation detection sensor according to claim 17, wherein the piezoelectric film is disposed opposite to the second surface of the substrate on which the joint member is disposed, and the second ground electrode disposed directly on the first surface of the substrate.

19. The deformation detection sensor according to claim 17, wherein the detection electrode comprises a first electrode disposed on the first surface of the substrate and a second electrode disposed on the second surface of the substrate.

20. The deformation detection sensor according to claim 19,
wherein the piezoelectric film is coupled to the first surface of the substrate with the first electrode of the detection electrode disposed therebetween, and
wherein the joint member is coupled to the second surface of the substrate with the second electrode of the detection electrode disposed therebetween.

* * * * *